(12) United States Patent
    Li

(10) Patent No.: US 9,885,933 B1
(45) Date of Patent: Feb. 6, 2018

(54) TFT ARRAY SUBSTRATE AND MANUFACTURING METHOD THEREOF

(71) Applicant: Wuhan China Star Optoelectronics Technology Co., Ltd., Wuhan (CN)

(72) Inventor: Anshi Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 69 days.

(21) Appl. No.: 15/114,848

(22) PCT Filed: May 17, 2016

(86) PCT No.: PCT/CN2016/082413
    § 371 (c)(1),
    (2) Date: Jul. 28, 2016

(87) PCT Pub. No.: WO2017/128561
    PCT Pub. Date: Aug. 3, 2017

(30) Foreign Application Priority Data

Jan. 28, 2016 (CN) .......................... 2016 1 0060834

(51) Int. Cl.
    *H01L 27/14* (2006.01)
    *G02F 1/1368* (2006.01)
    (Continued)

(52) U.S. Cl.
    CPC ........ *G02F 1/1368* (2013.01); *G02F 1/13439* (2013.01); *G02F 1/133345* (2013.01); *G02F 1/136209* (2013.01); *G02F 1/136227* (2013.01); *H01L 29/41733* (2013.01); *H01L 29/458* (2013.01); *G02F 2001/13685* (2013.01); *G02F 2001/133357* (2013.01);
    (Continued)

(58) Field of Classification Search
    CPC ............. H01L 29/41733; H01L 29/458; G02F 1/1368
    USPC ............................................. 257/59, 72, 432
    See application file for complete search history.

(56) References Cited

U.S. PATENT DOCUMENTS

2006/0050192 A1* 3/2006 Cho .................. G02F 1/136286
                                                    349/42

* cited by examiner

*Primary Examiner* — Tan N Tran
(74) *Attorney, Agent, or Firm* — Leong C. Lei

(57) ABSTRACT

The present invention provides a TFT array substrate and a manufacturing method thereof. The TFT array substrate has a source electrode (801) and a drain electrode (802), which each include, stacked from bottom to top, a first molybdenum layer (811), a first aluminum layer (812), a second aluminum layer (813), and a second molybdenum layer (814). The first aluminum layer (812) and the second aluminum layer (813) each have a surface including a plurality of spikes (8120) formed and distributed thereon. The spikes (8120) of the second aluminum layer (813) have a height greater than a height of the spikes (8120) of the first aluminum layer (812) such that the source electrode (801) and the drain electrode (802) each have an upper surface exhibiting a rough surface having irregularity comprising raised and recessed portion. Compared to a flat smooth surface that is involved in the prior art, the rough surface having irregularity comprising raised and recessed portions helps expand contact area between the drain electrode (802) and the pixel electrode (1200) so as to reduce contact impedance between a TFT and the pixel electrode and improve performance of a liquid crystal display panel.

13 Claims, 4 Drawing Sheets

(51) Int. Cl.
  *G02F 1/1362* (2006.01)
  *G02F 1/1333* (2006.01)
  *G02F 1/1343* (2006.01)
  *H01L 29/45* (2006.01)
  *H01L 29/417* (2006.01)
(52) U.S. Cl.
  CPC .. *G02F 2201/121* (2013.01); *G02F 2201/123* (2013.01); *G02F 2201/50* (2013.01); *G02F 2202/104* (2013.01)

TFT ARRAY SUBSTRATE AND MANUFACTURING METHOD THEREOF

BACKGROUND OF THE INVENTION

1. Field of the Invention

The present invention relates to the field of display technology, and in particular to a thin-film transistor (TFT) array substrate and a manufacturing method thereof.

2. The Related Arts

Liquid crystal displays (LCDs) have a variety of advantages, such as thin device body, low power consumption, and being free of radiation, and thus have wide applications, such as liquid crystal televisions, mobile phones, personal digital assistants (PDAs), digital cameras, computer monitors, and notebook computer screens, making them in a leading position in the field of flat panel displays.

Most of the LCDs that are currently available in the market are backlighting LCDs, which comprise a liquid crystal display panel and a backlight module. The working principle of the liquid crystal display panel is that with liquid crystal molecules filled between a thin-film transistor (TFT) array substrate and a color filter (CF) substrate, a drive voltage is applied to the two substrates to control a rotation direction of the liquid crystal molecules in order to refract out light emitting from the backlight module to generate an image.

A TFT array substrate comprises: a plurality of gate lines and data lines such that the plurality of gate lines and the plurality of data lines are perpendicular to each other to define a plurality of pixel units. Each of the pixel units comprises, arranged therein, a TFT, a pixel electrode, and a storage capacitor. The TFT comprises a gate electrode connected to the gate line, a source electrode connected to the data line, and a drain electrode connected to the pixel electrode. When the gate line is driven, the TFT is in a conducting state and the corresponding data line feeds in a gray-level voltage signal to load the pixel electrode, so as to generate a corresponding electric field between the pixel electrode and the common electrode and liquid crystal molecules contained in a liquid crystal layer are acted upon by the electric field to change the direction thereof thereby realizing displaying of various images.

Referring to FIG. 1, FIG. 1 is a cross-sectional view illustrating a conventional TFT array substrate. The TFT array substrate comprises: a backing plate 1, a light-shielding layer 2 arranged on the backing plate 1, a buffer layer 3 set on and covering the light-shielding layer 2 and the backing plate 1, a poly-silicon semiconductor layer 4 arranged on the buffer layer 3 and corresponding to the light-shielding layer 2, a gate insulation layer 5 set on and covering the poly-silicon semiconductor layer 4 and the buffer layer 3, a gate electrode 6 arranged on the gate insulation layer 5 and corresponding to the poly-silicon semiconductor layer 4, an interlayer insulation layer 7 set on and covering the gate electrode 6 and the gate insulation layer 5, a source electrode 81 and a drain electrode 82 arranged on the interlayer insulation layer 7, a planarization layer 9 set on and covering the source electrode 81, the drain electrode 82, and the interlayer insulation layer 7, a common electrode 10 arranged on the planarization layer 9, a protection layer 11 arranged on the common electrode 10, and a pixel electrode 12 arranged on the protection layer 11. The source electrode 81 and the drain electrode 82 are each of a structure comprising two layers of molybdenum (Mo) sandwiching a layer of aluminum (Al). The pixel electrode 12 is set in contact engagement with the drain electrode 82 through a via 91 that extends through the protection layer 11, the common electrode 10, and the planarization layer 9. As shown in FIG. 2, contact surfaces of the pixel electrode 12 and the drain electrode 82 are both smooth and flat surfaces and the contact area between the two is identical to a bottom area of the via 91 so that contact impedance is high and may affect the performance of a liquid crystal display panel.

SUMMARY OF THE INVENTION

An object of the present invention is to provide a thin-film transistor (TFT) array substrate, which helps reduce contact impedance between a TFT and a pixel electrode to improve performance of a liquid crystal display panel.

Another object of the present invention is to provide a manufacturing method of a TFT array substrate, which helps reduce contact impedance between a TFT and a pixel electrode to improve performance of a liquid crystal display panel.

To achieve the above objects, the present invention provides a TFT array substrate, which comprises: a backing plate, a light-shielding layer arranged on the backing plate, a buffer layer set on and covering the light-shielding layer and the backing plate, a poly-silicon semiconductor layer arranged on the buffer layer and corresponding to the light-shielding layer, a gate insulation layer set on and covering the poly-silicon semiconductor layer and the buffer layer, a gate electrode arranged on the gate insulation layer and corresponding to the poly-silicon semiconductor layer, an interlayer insulation layer set on and covering the gate electrode and the gate insulation layer, a source electrode and a drain electrode arranged on the interlayer insulation layer, a planarization layer set on and covering the source electrode, the drain electrode, and the interlayer insulation layer, a common electrode arranged on the planarization layer, a protection layer arranged on the common electrode, and a pixel electrode arranged on the protection layer;

wherein the source electrode and the drain electrode each comprise a first molybdenum layer, a first aluminum layer, a second aluminum layer, and a second molybdenum layer that are stacked on each other in sequence from bottom to top, wherein the first molybdenum layer has a surface that is smooth; the first aluminum layer and the second aluminum layer each have a surface on which a plurality of sharp spikes are formed and distributed such that the spikes of the second aluminum layer have a height that is greater than a height of the spikes of the first aluminum layer; and the second molybdenum layer has a surface that is substantially smooth and covers on the spikes of the second aluminum layer to reduce the sharpness of the spikes of the second aluminum layer so that an upper surface of each of the source electrode and the drain electrode exhibits a rough surface having irregularity comprising raised and recessed portions; and the pixel electrode is set in contact engagement with the upper surface of the drain electrode by means of a via extending through the protection layer, the common electrode, and the planarization layer.

The source electrode and the drain electrode are respectively set in contact engagement with two ends of the poly-silicon semiconductor layer by means of vias extending through the interlayer insulation layer and the gate insulation layer.

The light-shielding layer is formed of a material comprising molybdenum.

The buffer layer comprises a first silicon nitride layer and a first silicon oxide layer that are stacked sequentially from bottom to top;

the gate insulation layer comprises a second silicon oxide layer and a second silicon nitride layer that are stacked sequentially from bottom to top;

the interlayer insulation layer comprises a third silicon nitride layer and a third silicon oxide layer that are stacked sequentially from bottom to top; and the protection layer is formed of a material comprising silicon nitride.

The pixel electrode and the common electrode are both formed of a material comprising indium tin oxide (ITO).

The present invention also provides a manufacturing method of a TFT array substrate, which comprises the following steps:

(1) providing a backing plate and forming, in sequence from bottom to top, a light-shielding layer, a buffer layer, a poly-silicon semiconductor layer, a gate insulation layer, a gate electrode, and an interlayer insulation layer on the backing plate;

(2) depositing a first molybdenum layer on the interlayer insulation layer such that the first molybdenum layer has a surface that is smooth;

(3) depositing a first aluminum layer on the first molybdenum layer such that the first aluminum layer has a surface, which comprises a plurality of spikes formed and distributed thereon;

(4) depositing a second aluminum layer on the first aluminum layer such that the second aluminum layer has a surface, which also comprises a plurality of spikes formed and distributed thereon and the spikes of the second aluminum layer have a height that is greater than a height of the spikes of the first aluminum layer;

(5) depositing a second molybdenum layer on the second aluminum layer such that the second molybdenum layer has a surface that is substantially smooth and is set on and covers the spikes of the second aluminum layer to reduce sharpness of the spikes of the second aluminum layer and subjecting the first molybdenum layer, the first aluminum layer, the second aluminum layer, and the second molybdenum layer to patterning treatment to form a source electrode and a drain electrode located on the interlayer insulation layer, wherein the source electrode and the drain electrode each have an upper surface that exhibits a rough surface having irregularity comprising raised and recessed portions; and (6) forming, in sequence from bottom to top, a planarization layer, a common electrode, a protection layer, and a pixel electrode on the source electrode, the drain electrode, and the interlayer insulation layer, wherein the pixel electrode is set in contact engagement with the upper surface of the drain electrode by means of a via that extends through the protection layer, the common electrode, and the planarization layer.

The source electrode and the drain electrode are respectively set in contact engagement with two ends of the poly-silicon semiconductor layer by means of vias extending through the interlayer insulation layer and the gate insulation layer.

The light-shielding layer is formed of a material comprising molybdenum.

The buffer layer comprises a first silicon nitride layer and a first silicon oxide layer that are stacked sequentially from bottom to top;

the gate insulation layer comprises a second silicon oxide layer and a second silicon nitride layer that are stacked sequentially from bottom to top;

the interlayer insulation layer comprises a third silicon nitride layer and a third silicon oxide layer that are stacked sequentially from bottom to top; and the protection layer is formed of a material comprising silicon nitride.

The pixel electrode and the common electrode are both formed of a material comprising ITO.

The present invention further provides a TFT array substrate, which comprises: a backing plate, a light-shielding layer arranged on the backing plate, a buffer layer set on and covering the light-shielding layer and the backing plate, a poly-silicon semiconductor layer arranged on the buffer layer and corresponding to the light-shielding layer, a gate insulation layer set on and covering the poly-silicon semiconductor layer and the buffer layer, a gate electrode arranged on the gate insulation layer and corresponding to the poly-silicon semiconductor layer, an interlayer insulation layer set on and covering the gate electrode and the gate insulation layer, a source electrode and a drain electrode arranged on the interlayer insulation layer, a planarization layer set on and covering the source electrode, the drain electrode, and the interlayer insulation layer, a common electrode arranged on the planarization layer, a protection layer arranged on the common electrode, and a pixel electrode arranged on the protection layer;

wherein the source electrode and the drain electrode each comprise a first molybdenum layer, a first aluminum layer, a second aluminum layer, and a second molybdenum layer that are stacked on each other in sequence from bottom to top, wherein the first molybdenum layer has a surface that is smooth; the first aluminum layer and the second aluminum layer each have a surface on which a plurality of sharp spikes are formed and distributed such that the spikes of the second aluminum layer have a height that is greater than a height of the spikes of the first aluminum layer; and the second molybdenum layer has a surface that is substantially smooth and covers on the spikes of the second aluminum layer to reduce the sharpness of the spikes of the second aluminum layer so that an upper surface of each of the source electrode and the drain electrode exhibits a rough surface having irregularity comprising raised and recessed portions; and the pixel electrode is set in contact engagement with the upper surface of the drain electrode by means of a via extending through the protection layer, the common electrode, and the planarization layer;

wherein the source electrode and the drain electrode are respectively set in contact engagement with two ends of the poly-silicon semiconductor layer by means of vias extending through the interlayer insulation layer and the gate insulation layer; and wherein the light-shielding layer is formed of a material comprising molybdenum.

The efficacy of the present invention is that the present invention provides a TFT array substrate. The TFT array substrate has a source electrode and a drain electrode, which each comprise, stacked from bottom to top, a first molybdenum layer, a first aluminum layer, a second aluminum layer, and a second molybdenum layer, wherein the first aluminum layer and the second aluminum layer each have a surface comprising a plurality of spikes formed and distributed thereon and the spikes of the second aluminum layer have a height greater than a height of the spikes of the first aluminum layer such that the source electrode and the drain electrode each have an upper surface exhibiting a rough surface having irregularity comprising raised and recessed portion. Compared to a flat smooth surface that is involved in the prior art, the rough surface having irregularity comprising raised and recessed portions helps expand contact area between the drain electrode and the pixel electrode so as to reduce contact impedance between a TFT and the pixel electrode and improve performance of a liquid crystal display panel. The present invention also provides a manufacturing method of a TFT array substrate, which helps reduce contact impedance between a TFT and a pixel electrode and improve performance of a liquid crystal display panel.

BRIEF DESCRIPTION OF THE DRAWINGS

The features and technical contents of the present invention will be better understood by referring to the following detailed description and drawings of the present invention. However, the drawings are provided for the purpose of reference and illustration and are not intended to limit the scope of the present invention.

In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 5:
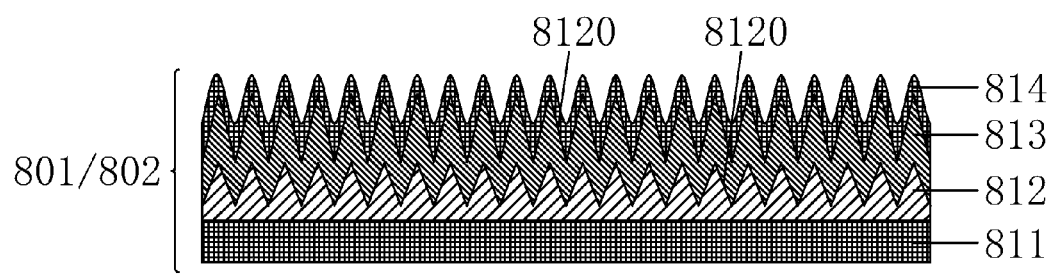
FIG. 5 is a schematic view illustrating a source electrode and a drain electrode formed with step 5 of the manufacturing method of the TFT array substrate according to the present invention.
Figure 6:
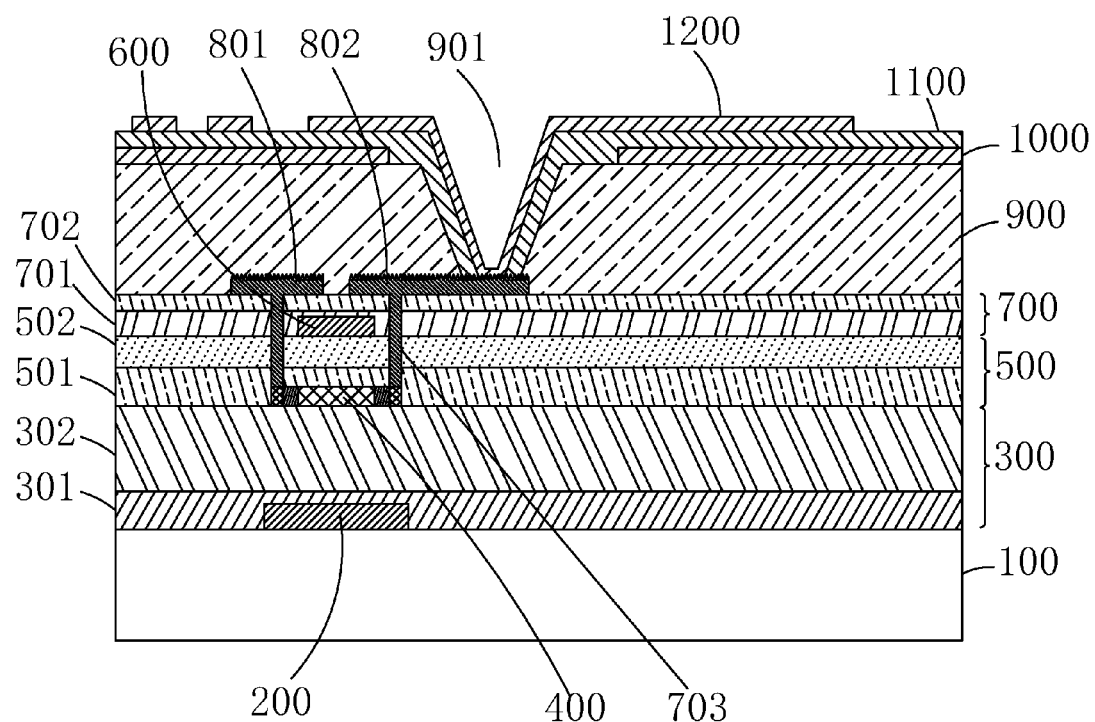
FIG. 6 is a schematic view illustrating step 6 of the manufacturing method of the TFT array substrate according to the present invention and illustrating a cross-section of the TFT array substrate according o the present invention.

Referring to FIGS. 6 and 5, firstly, the present invention provides a TFT array substrate, which comprises: a backing plate 100, a light-shielding layer 200 arranged on the backing plate 100, a buffer layer 300 set on and covering the light-shielding layer 200 and the backing plate 100, a poly-silicon semiconductor layer 400 arranged on the buffer layer 300 and corresponding to the light-shielding layer 200, a gate insulation layer 500 set on and covering the poly-silicon semiconductor layer 400 and the buffer layer 300, a gate electrode 600 arranged on the gate insulation layer 500 and corresponding to the poly-silicon semiconductor layer 400, an interlayer insulation layer 700 set on and covering the gate electrode 600 and the gate insulation layer 500, a source electrode 801 and a drain electrode 802 arranged on the interlayer insulation layer 700, a planarization layer 900 set on and covering the source electrode 801, the drain electrode 802, and the interlayer insulation layer 700, a common electrode 1000 arranged on the planarization layer 900, a protection layer 1100 arranged on the common electrode 1000, and a pixel electrode 1200 arranged on the protection layer 1100.

The source electrode 801 and the drain electrode 802 each comprise a first molybdenum layer 811, a first aluminum layer 812, a second aluminum layer 813, and a second molybdenum layer 814 that are stacked on each other in sequence from bottom to top, wherein the first molybdenum layer 811 has a surface that is smooth; the first aluminum layer 812 and the second aluminum layer 813 each have a surface on which a plurality of sharp spikes 8120 are formed and distributed such that the spikes 8120 of the second aluminum layer 813 have a height that is greater than a height of the spikes 8120 of the first aluminum layer 812; and the second molybdenum layer 814 has a surface that is substantially smooth and covers on the spikes 8120 of the second aluminum layer 813 to reduce the sharpness of the spikes 8120 of the second aluminum layer 813 so that, eventually, an upper surface of each of the source electrode 801 and the drain electrode 802 exhibits a rough surface having irregularity comprising raised and recessed portions.

The pixel electrode 1200 is set in contact engagement with the upper surface of the drain electrode 802 by means of a via 901 extending through the protection layer 1100, the common electrode 1000, and the planarization layer 900.

Specifically, the present invention comprises an arrangement of a second aluminum layer 813 having relatively high surface roughness to provide sufficient roughness on the upper surfaces of the source electrode 801 and the drain electrode 802, while the first aluminum layer 812 that has relatively low roughness is arranged under the second aluminum layer 813 to ensure a flat portion that is located below the rough surfaces of the source electrode 801 and the drain electrode 802 has a sufficient thickness.

The source electrode 801 and the drain electrode 802 are respectively set in contact engagement with two ends of the poly-silicon semiconductor layer 400 by means of vias 703 extending through the interlayer insulation layer 700 and the gate insulation layer 500.

Figure 1:
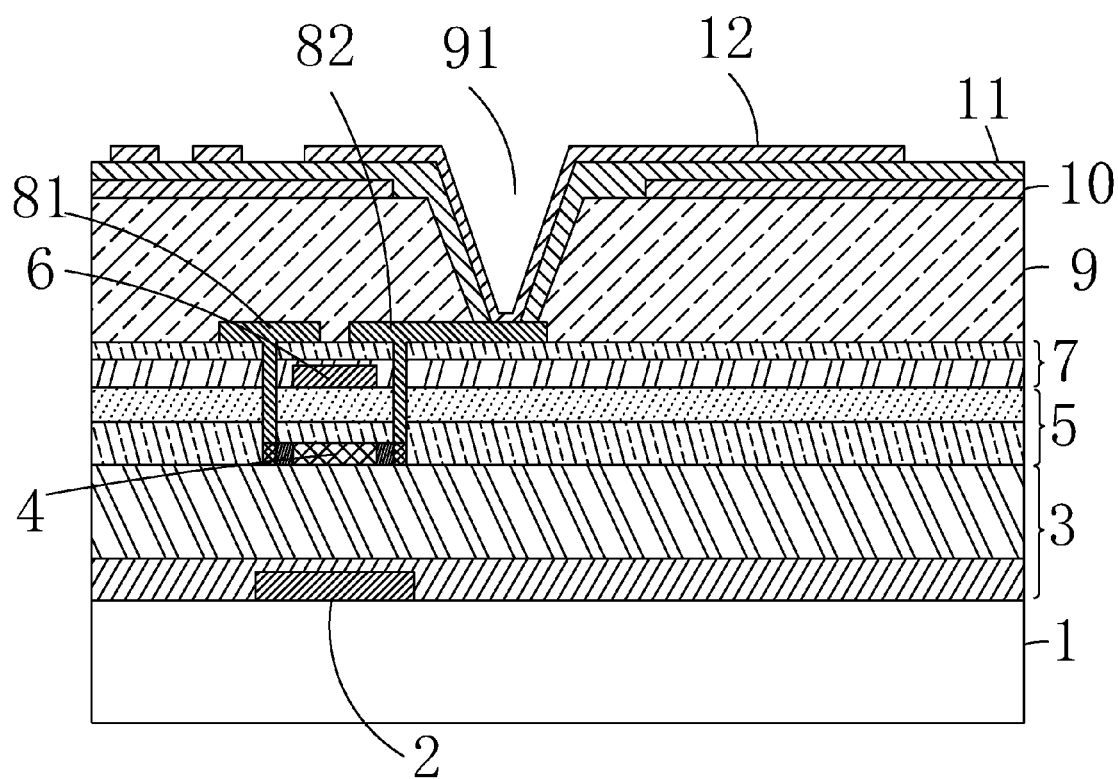
FIG. 1 is a cross-sectional view illustrating a conventional thin-film transistor (TFT) array substrate.
Figure 2:
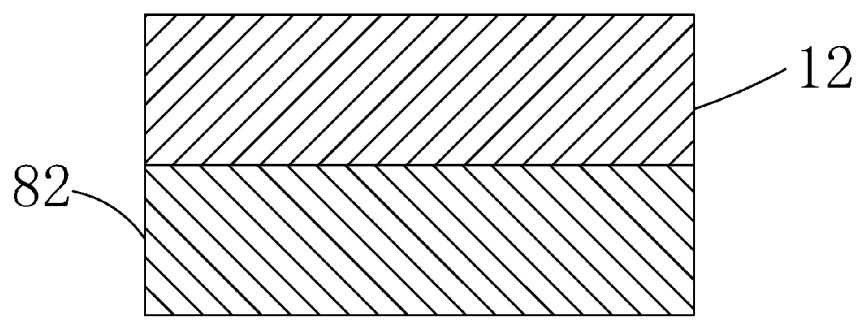
FIG. 2 is a schematic view illustrating a contact surface between a drain electrode and a pixel electrode of the TFT array substrate illustrated in FIG. 1.
Figure 7:
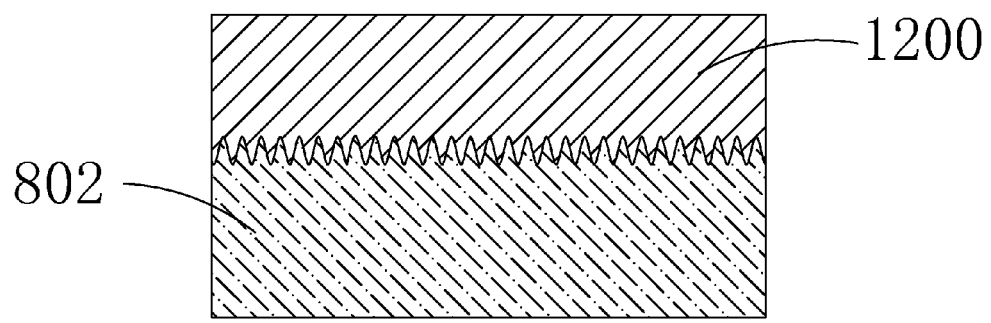
FIG. 7 is a schematic view illustrating a contact surface between a drain electrode and a pixel electrode of the TFT array substrate according to the present invention.

Particularly, referring to FIGS. 2 and 7, in the prior art, the contact surfaces between a pixel electrode and a drain electrode are smooth and flat surfaces so that the contact area between the two is identical to a bottom area of a via; while in the present invention, a first aluminum layer 812 and a second aluminum layer 813 that are of different levels of roughness are stacked such that an upper surface of the drain electrode 802 (namely a surface in contact with the pixel electrode) exhibits a rough surfaces having irregularity comprising raised and recessed portions, whereby the contact surface between the pixel electrode 1200 and the drain electrode 802 is changed from planar surface contact into curved surface contact so as to greatly increase the contact area and thus reducing contact impedance between a TFT and the pixel electrode and improving the performance of a liquid crystal display panel.

Preferably, the light-shielding layer 200 is formed of a material comprising molybdenum.

Preferably, the buffer layer 300 comprises a first silicon nitride layer 301 and a first silicon oxide layer 302 that are stacked sequentially from bottom to top; and the gate insulation layer 500 comprises a second silicon oxide layer 501 and a second silicon nitride layer 502 that are stacked sequentially from bottom to top; and the interlayer insulation layer 700 comprises a third silicon nitride layer 701 and a third silicon oxide layer 702 that are stacked sequentially from bottom to top.

Preferably, the protection layer 1100 is formed of a material comprising silicon nitride.

Preferably, the pixel electrode 1200 and the common electrode 1000 are both formed of a material comprising indium tin oxide (ITO).

Figure 3:
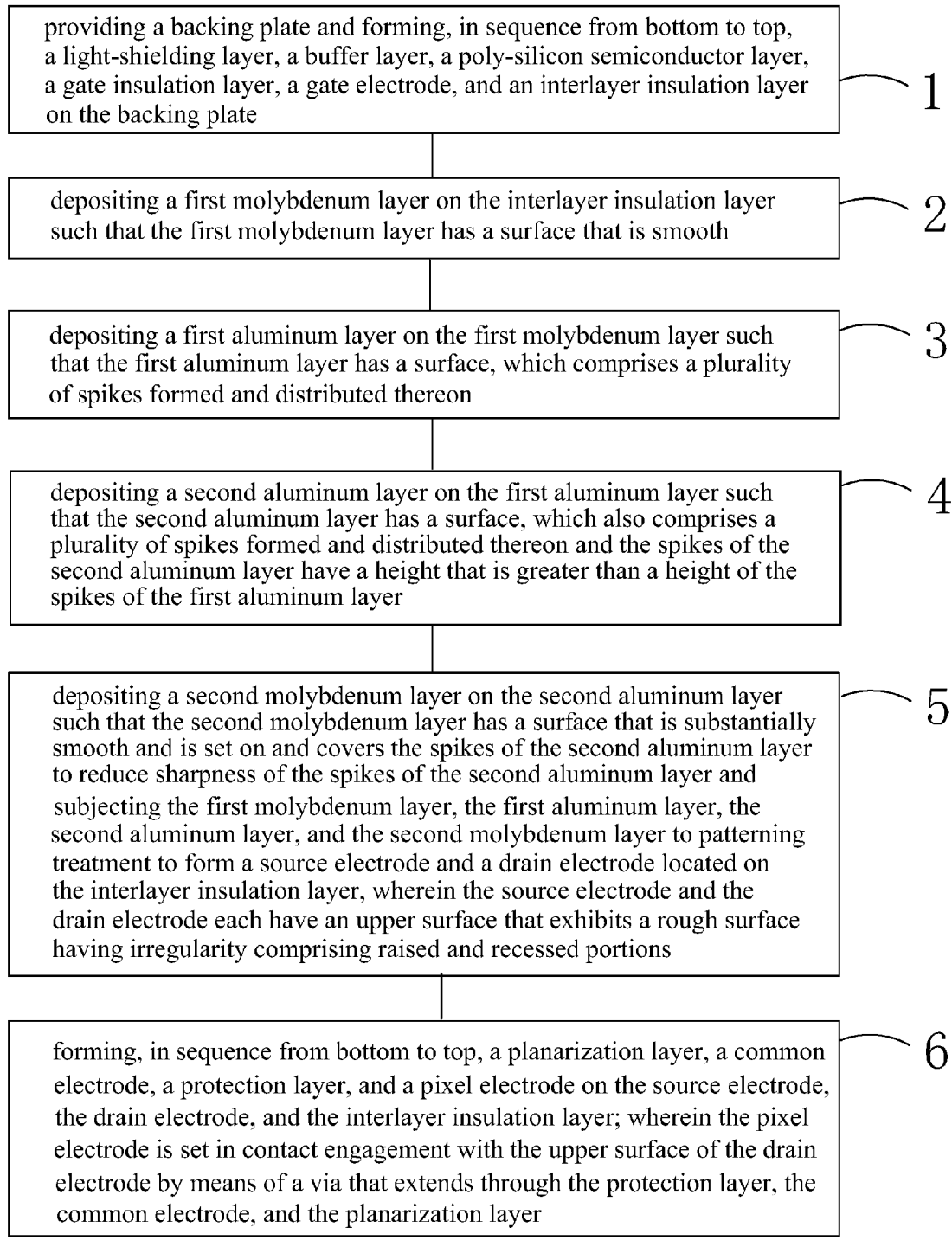
FIG. 3 is a flow chart illustrating a manufacturing method of a TFT array substrate according to the present invention.
Figure 4:
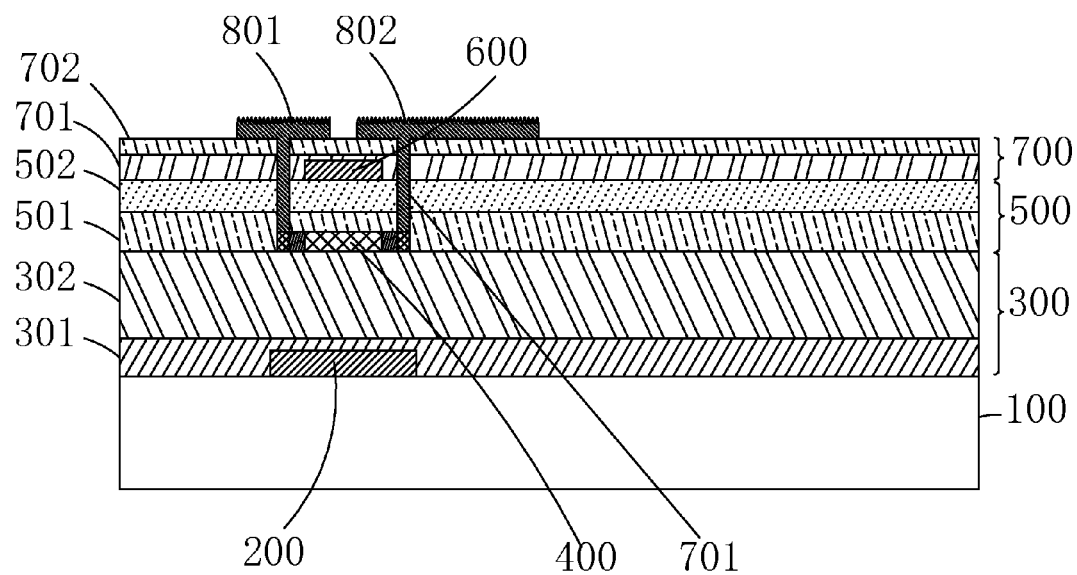
FIG. 4 is a schematic view illustrating steps 1-5 of the manufacturing method of the TFT array substrate according to the present invention.

Referring to FIG. 3, in combination with FIGS. 4-7, the present invention also provides a manufacturing method of a TFT array substrate, which comprises the following steps:

Step 1: referring to FIG. 4, providing a backing plate 100 and forming, in sequence from bottom to top, a light-shielding layer 200, a buffer layer 300, a poly-silicon semiconductor layer 400, a gate insulation layer 500, a gate electrode 600, and an interlayer insulation layer 700 on the backing plate 100.

Specifically, Step 1 comprises:

Step 11: depositing a metal film on the backing plate 100 and patterning the metal film to form the light-shielding layer 200, wherein, preferably, the metal film is formed of a material comprising molybdenum;

Step 12: forming a first silicon nitride layer 301 in the form of a film on the light-shielding layer 200 and the backing plate 100 and forming a first silicon oxide layer 302 in the form of a film on the first silicon nitride layer 301 so as to form the buffer layer 300;

Step 13: depositing a amorphous silicon layer on the buffer layer 300 and subjecting the amorphous silicon layer to crystallization treatment to form a poly-silicon layer, and subjecting the poly-silicon layer to patterning and ion doping processes so as to form the poly-silicon semiconductor layer 400 that is located on the buffer layer 300 and corresponding to the light-shielding layer 200;

Step 14: forming and patterning a second silicon oxide layer 501 on the poly-silicon semiconductor layer 400 and the buffer layer 300 and forming and patterning a second silicon nitride layer 502 on the second silicon oxide layer 501 so as to form the gate insulation layer 500;

Step 15: depositing and patterning a metal film on the gate insulation layer 500 to form the gate electrode 600 that is located on the gate insulation layer 500 and corresponding to the poly-silicon semiconductor layer 400; and Step 16: depositing, in sequence, a third silicon nitride layer 701 and a third silicon oxide layer 702 on the gate electrode 600 and the gate insulation layer 500 to form the interlayer insulation layer 700 and subjecting the interlayer insulation layer 700 and the gate insulation layer 500 to patterning treatment simultaneously to form vias 703 that extend through the interlayer insulation layer 700 and the gate insulation layer 500 and expose two ends of the poly-silicon semiconductor layer 400 respectively.

Step 2: depositing a first molybdenum layer 811 on the interlayer insulation layer 700 such that the first molybdenum layer 811 has a surface that is smooth.

Step 3: depositing a first aluminum layer 812 on the first molybdenum layer 811 such that the first aluminum layer 812 has a surface, which comprises a plurality of spikes 8120 formed and distributed thereon.

Step 4: depositing a second aluminum layer 813 on the first aluminum layer 812 such that the second aluminum layer 813 has a surface, which also comprises a plurality of spikes 8120 formed and distributed thereon and the spikes 8120 of the second aluminum layer 813 have a height that is greater than a height of the spikes 8120 of the first aluminum layer 812, wherein the second aluminum layer 813 has roughness that is greater than roughness of the first aluminum layer 812.

Specifically, Step 3 and Step 4 use sputtering to form the first aluminum layer 812 and the second aluminum layer 813 and adopt measures, such as controlling the period of depositing time or adjusting composition of sputtering target (such as the contents of trace elements), to control roughness (height of the spikes) of the aluminum layers so deposited.

Step 5: depositing a second molybdenum layer 814 on the second aluminum layer 813 such that the second molybdenum layer 814 has a surface that is substantially smooth and is set on and covers the spikes 8120 of the second aluminum layer 813 to reduce sharpness of the spikes 8120 of the second aluminum layer 813 and subjecting the first molybdenum layer 811, the first aluminum layer 812, the second aluminum layer 813, and the second molybdenum layer 814 to patterning treatment to form a source electrode 801 and a drain electrode 802 located on the interlayer insulation layer 700, wherein the source electrode 801 and the drain electrode 802 each have an upper surface that exhibits a rough surface having irregularity comprising raised and recessed portions.

Specifically, the source electrode 801 and the drain electrode 802 are respectively set in contact engagement with the two ends of the poly-silicon semiconductor layer 400 by means of vias 703 extending through the interlayer insulation layer 700 and the gate insulation layer 500.

Step 6: referring to FIG. 6, forming, in sequence from bottom to top, a planarization layer 900, a common electrode 1000, a protection layer 1000, and a pixel electrode 1200 on the source electrode 801, the drain electrode 802, and the interlayer insulation layer 700.

Specifically, the pixel electrode 1200 is set in contact engagement with the upper surface of the drain electrode 802 by means of a via 901 that extends through the protection layer 1100, the common electrode 1000, and the planarization layer 900.

Preferably, the pixel electrode 1200 and the common electrode 1000 are each formed of a material comprising ITO.

Particularly, referring to FIGS. 2 and 7, in the prior art, the contact surfaces between a pixel electrode and a drain electrode are smooth and flat surfaces so that the contact area between the two is identical to a bottom area of a via; while in the present invention, a first aluminum layer 812 and a second aluminum layer 813 that are of different levels of roughness are sequentially deposited such that an upper surface of the drain electrode 802 (namely a surface in contact with the pixel electrode) exhibits a rough surfaces having irregularity comprising raised and recessed portions, whereby the contact surface between the pixel electrode 1200 and the drain electrode 802 is changed from planar surface contact into curved surface contact so as to greatly increase the contact area and thus reducing contact impedance between a TFT and the pixel electrode and improving the performance of a liquid crystal display panel.

In summary, the present invention provides a TFT array substrate. The TFT array substrate has a source electrode and a drain electrode, which each comprise, stacked from bottom to top, a first molybdenum layer, a first aluminum layer, a second aluminum layer, and a second molybdenum layer, wherein the first aluminum layer and the second aluminum layer each have a surface comprising a plurality of spikes formed and distributed thereon and the spikes of the second aluminum layer have a height greater than a height of the spikes of the first aluminum layer such that the source electrode and the drain electrode each have an upper surface exhibiting a rough surface having irregularity comprising raised and recessed portion. Compared to a flat smooth surface that is involved in the prior art, the rough surface having irregularity comprising raised and recessed portions helps expand contact area between the drain electrode and the pixel electrode so as to reduce contact impedance between a TFT and the pixel electrode and improve performance of a liquid crystal display panel. The present invention also provides a manufacturing method of a TFT array substrate, which helps reduce contact impedance between a TFT and a pixel electrode and improve performance of a liquid crystal display panel.

Based on the description given above, those having ordinary skills of the art may easily contemplate various changes and modifications of the technical solution and technical ideas of the present invention and all these changes and modifications are considered within the protection scope defined by the claims of the present invention.

What is claimed is:

1. A thin-film transistor (TFT) array substrate, comprising: a backing plate, a light-shielding layer arranged on the backing plate, a buffer layer set on and covering the light-shielding layer and the backing plate, a poly-silicon semiconductor layer arranged on the buffer layer and corresponding to the light-shielding layer, a gate insulation layer set on and covering the poly-silicon semiconductor layer and the buffer layer, a gate electrode arranged on the gate insulation layer and corresponding to the poly-silicon semiconductor layer, an interlayer insulation layer set on and covering the gate electrode and the gate insulation layer, a source electrode and a drain electrode arranged on the interlayer insulation layer, a planarization layer set on and covering the source electrode, the drain electrode, and the interlayer insulation layer, a common electrode arranged on the planarization layer, a protection layer arranged on the common electrode, and a pixel electrode arranged on the protection layer;

wherein the source electrode and the drain electrode each comprise a first molybdenum layer, a first aluminum layer, a second aluminum layer, and a second molybdenum layer that are stacked on each other in sequence from bottom to top, wherein the first molybdenum layer has a surface that is smooth; the first aluminum layer and the second aluminum layer each have a surface on which a plurality of sharp spikes are formed and distributed such that the spikes of the second aluminum layer have a height that is greater than a height of the spikes of the first aluminum layer; and the second molybdenum layer has a surface that is substantially smooth and covers on the spikes of the second aluminum layer to reduce the sharpness of the spikes of the second aluminum layer so that an upper surface of each of the source electrode and the drain electrode exhibits a rough surface having irregularity comprising raised and recessed portions; and the pixel electrode is set in contact engagement with the upper surface of the drain electrode by means of a via extending through the protection layer, the common electrode, and the planarization layer.

2. The TFT array substrate as claimed in claim 1, wherein the source electrode and the drain electrode are respectively set in contact engagement with two ends of the poly-silicon semiconductor layer by means of vias extending through the interlayer insulation layer and the gate insulation layer.

3. The TFT array substrate as claimed in claim 1, wherein the light-shielding layer is formed of a material comprising molybdenum.

4. The TFT array substrate as claimed in claim 1, wherein the buffer layer comprises a first silicon nitride layer and a first silicon oxide layer that are stacked sequentially from bottom to top;

the gate insulation layer comprises a second silicon oxide layer and a second silicon nitride layer that are stacked sequentially from bottom to top;

the interlayer insulation layer comprises a third silicon nitride layer and a third silicon oxide layer that are stacked sequentially from bottom to top; and the protection layer is formed of a material comprising silicon nitride.

5. The TFT array substrate as claimed in claim 1, wherein the pixel electrode and the common electrode are both formed of a material comprising indium tin oxide (ITO).

6. A manufacturing method of a thin-film transistor (TFT) array substrate, comprising the following steps:

(1) providing a backing plate and forming, in sequence from bottom to top, a light-shielding layer, a buffer layer, a poly-silicon semiconductor layer, a gate insulation layer, a gate electrode, and an interlayer insulation layer on the backing plate;

(2) depositing a first molybdenum layer on the interlayer insulation layer such that the first molybdenum layer has a surface that is smooth;

(3) depositing a first aluminum layer on the first molybdenum layer such that the first aluminum layer has a surface, which comprises a plurality of spikes formed and distributed thereon;

(4) depositing a second aluminum layer on the first aluminum layer such that the second aluminum layer has a surface, which also comprises a plurality of spikes formed and distributed thereon and the spikes of the second aluminum layer have a height that is greater than a height of the spikes of the first aluminum layer;

(5) depositing a second molybdenum layer on the second aluminum layer such that the second molybdenum layer has a surface that is substantially smooth and is set on and covers the spikes of the second aluminum layer to reduce sharpness of the spikes of the second aluminum layer and subjecting the first molybdenum layer, the first aluminum layer, the second aluminum layer, and the second molybdenum layer to patterning treatment to form a source electrode and a drain electrode located on the interlayer insulation layer, wherein the source electrode and the drain electrode each have an upper surface that exhibits a rough surface having irregularity comprising raised and recessed portions; and (6) forming, in sequence from bottom to top, a planarization layer, a common electrode, a protection layer, and a pixel electrode on the source electrode, the drain electrode, and the interlayer insulation layer, wherein the pixel electrode is set in contact engagement with the upper surface of the drain electrode by means of a via that extends through the protection layer, the common electrode, and the planarization layer.

7. The manufacturing method of the TFT array substrate as claimed in claim 6, wherein the source electrode and the drain electrode are respectively set in contact engagement with two ends of the poly-silicon semiconductor layer by means of vias extending through the interlayer insulation layer and the gate insulation layer.

8. The manufacturing method of the TFT array substrate as claimed in claim 6, wherein the light-shielding layer is formed of a material comprising molybdenum.

9. The manufacturing method of the TFT array substrate as claimed in claim 6, wherein the buffer layer comprises a first silicon nitride layer and a first silicon oxide layer that are stacked sequentially from bottom to top;
the gate insulation layer comprises a second silicon oxide layer and a second silicon nitride layer that are stacked sequentially from bottom to top;
the interlayer insulation layer comprises a third silicon nitride layer and a third silicon oxide layer that are stacked sequentially from bottom to top; and
the protection layer is formed of a material comprising silicon nitride.

10. The manufacturing method of the TFT array substrate as claimed in claim 6, wherein the pixel electrode and the common electrode are both formed of a material comprising indium tin oxide (ITO).

11. A thin-film transistor (TFT) array substrate, comprising: a backing plate, a light-shielding layer arranged on the backing plate, a buffer layer set on and covering the light-shielding layer and the backing plate, a poly-silicon semiconductor layer arranged on the buffer layer and corresponding to the light-shielding layer, a gate insulation layer set on and covering the poly-silicon semiconductor layer and the buffer layer, a gate electrode arranged on the gate insulation layer and corresponding to the poly-silicon semiconductor layer, an interlayer insulation layer set on and covering the gate electrode and the gate insulation layer, a source electrode and a drain electrode arranged on the interlayer insulation layer, a planarization layer set on and covering the source electrode, the drain electrode, and the interlayer insulation layer, a common electrode arranged on the planarization layer, a protection layer arranged on the common electrode, and a pixel electrode arranged on the protection layer;
wherein the source electrode and the drain electrode each comprise a first molybdenum layer, a first aluminum layer, a second aluminum layer, and a second molybdenum layer that are stacked on each other in sequence from bottom to top, wherein the first molybdenum layer has a surface that is smooth; the first aluminum layer and the second aluminum layer each have a surface on which a plurality of sharp spikes are formed and distributed such that the spikes of the second aluminum layer have a height that is greater than a height of the spikes of the first aluminum layer; and the second molybdenum layer has a surface that is substantially smooth and covers on the spikes of the second aluminum layer to reduce the sharpness of the spikes of the second aluminum layer so that an upper surface of each of the source electrode and the drain electrode exhibits a rough surface having irregularity comprising raised and recessed portions; and
the pixel electrode is set in contact engagement with the upper surface of the drain electrode by means of a via extending through the protection layer, the common electrode, and the planarization layer;
wherein the source electrode and the drain electrode are respectively set in contact engagement with two ends of the poly-silicon semiconductor layer by means of vias extending through the interlayer insulation layer and the gate insulation layer; and
wherein the light-shielding layer is formed of a material comprising molybdenum.

12. The TFT array substrate as claimed in claim 11, wherein the buffer layer comprises a first silicon nitride layer and a first silicon oxide layer that are stacked sequentially from bottom to top;
the gate insulation layer comprises a second silicon oxide layer and a second silicon nitride layer that are stacked sequentially from bottom to top;
the interlayer insulation layer comprises a third silicon nitride layer and a third silicon oxide layer that are stacked sequentially from bottom to top; and
the protection layer is formed of a material comprising silicon nitride.

13. The TFT array substrate as claimed in claim 11, wherein the pixel electrode and the common electrode are both formed of a material comprising indium tin oxide (ITO).

* * * * *